United States Patent
Tsukazaki

(10) Patent No.: US 9,053,851 B2
(45) Date of Patent: Jun. 9, 2015

(54) CRYSTAL AND LAMINATE

(71) Applicant: Japan Science and Technology Agency, Saitama (JP)

(72) Inventor: Atsushi Tsukazaki, Tokyo (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 14/349,974

(22) PCT Filed: Oct. 3, 2012

(86) PCT No.: PCT/JP2012/075662
§ 371 (c)(1),
(2) Date: Apr. 4, 2014

(87) PCT Pub. No.: WO2013/051612
PCT Pub. Date: Apr. 11, 2013

(65) Prior Publication Data
US 2014/0255687 A1    Sep. 11, 2014

(30) Foreign Application Priority Data

Oct. 6, 2011    (JP) .................................. 2011-222161

(51) Int. Cl.
| | | |
|---|---|---|
| H01F 10/18 | (2006.01) | |
| H01L 43/08 | (2006.01) | |
| H01F 10/193 | (2006.01) | |
| H01L 43/10 | (2006.01) | |
| B82Y 25/00 | (2011.01) | |

(52) U.S. Cl.
CPC ............ *H01F 10/18* (2013.01); *Y10T 428/265* (2015.01); *H01L 43/08* (2013.01); *B82Y 25/00* (2013.01); *H01F 10/193* (2013.01); *H01L 43/10* (2013.01)

(58) Field of Classification Search
None
See application file for complete search history.

(56) References Cited

U.S. PATENT DOCUMENTS

| | | | | |
|---|---|---|---|---|
| 7,525,128 | B2* | 4/2009 | Nause et al. ................... | 257/102 |
| 2002/0047497 | A1* | 4/2002 | Higuchi et al. ............... | 310/322 |
| 2004/0235212 | A1* | 11/2004 | Ishizaki ......................... | 438/46 |
| 2006/0220029 | A1* | 10/2006 | Ishikazi ......................... | 257/79 |

(Continued)

FOREIGN PATENT DOCUMENTS

| | | | |
|---|---|---|---|
| JP | 2003-046128 A | 2/2003 | |
| JP | 2008-198743 A | 8/2008 | |

(Continued)

OTHER PUBLICATIONS

Sukit Limpijumnong et al., "Theoretical study of the relative stability of wurtzite and rocksalt phases in MgO and GaN", Physical Review B, vol. 63, 104103, Feb. 14, 2001, pp. 104103-1 to 104103-11 (11 sheets), The American Physical Society.

(Continued)

*Primary Examiner* — David Sample
(74) *Attorney, Agent, or Firm* — Fishman Stewart Yamaguchi PLLC

(57) ABSTRACT

The present invention relates to a laminate that includes: a foundation layer (12) that is a crystal having a wurtzite structure; and a $Mg_XM_{1-X}O$ film (14) having a hexagonal film formed on the foundation layer, where M is a 3d transition metal element, and $0<X<1$. The present invention also relates to a crystal that is $Mg_XM_{1-X}O$ having a hexagonal structure, where M is a 3d transition metal element, and $0<X<1$.

11 Claims, 7 Drawing Sheets

(56) References Cited

U.S. PATENT DOCUMENTS

| | | | |
|---|---|---|---|
| 2009/0061559 A1* | 3/2009 | Yamamuro et al. | 438/104 |
| 2010/0289004 A1* | 11/2010 | Nakahara et al. | 257/15 |
| 2011/0114937 A1 | 5/2011 | Nakahara et al. | |
| 2012/0181531 A1 | 7/2012 | Nakahara et al. | |

FOREIGN PATENT DOCUMENTS

| | | |
|---|---|---|
| JP | 2009-043920 A | 2/2009 |
| JP | 2009-060098 A | 3/2009 |

OTHER PUBLICATIONS

Shigeki Onoda et. al., "Intrinsic Versus Extrinsic Anomalous Hall Effect in Ferromagnets", Physical Review Letters, PRL 97, 126602, Sep. 22, 2006, pp. 126602-1 to 126602-4 (4 sheets), The American Physical Society.

Tomoteru Fukumura et al., "A Scaling Relation of Anomalous Hall Effect in Ferromagnetic Semiconductors and Metals", Japanese Journal of Applied Physics, vol. 46, No. 26, Jun. 29, 2007, pp. L642 to L644 (3 sheets), The Japan Society of Applied Physics.

Mingshan Xue et al., "Tunable surface band gap in $Mg_xZn_{1-x}O$ thin films", The Journal of Chemical Physics 129, 234707, Dec. 17, 2008, pp. 234707-1 to 234707-6 (6 sheets), American Institute of Physics.

S S Hullavarad et al., "Homo-and hetero-epitaxial growth of hexagonal and cubic $Mg_xZn_{1-x}O$ alloy thin films by pulsed laser deposition technique", Journal of Physics D: Applied Physics, 40, Aug. 3, 2007, pp. 4887 to 4895 (9 sheets), IOP Publishing Ltd., UK.

B.L. Stevens et al., "Structure and interdiffusion of epitaxial ZnO/ZnMgO nanolayered thin films", Journal of Vacuum Science Technology, vol. 26, No. 6, Nov. 3, 2008, pp. 1538 to 1541 (4 sheets), American Vacuum Society.

Zhang Baoping et al., "Growth and Optical Properties of ZnO Films and Quantum Wells", Chinese Journal of Semiconductors, vol. 27, No. 4, Apr. 2006, pp. 613 to 622 (10 sheets), Chinese Institute of Electronics.

International Search Report issued in Application No. PCT/JP2012/075662, mailed Jan. 8, 2013.

Written Opinion of International Search Suthority of PCT/JP2012/075662, mailed Jan. 8, 2013.

* cited by examiner

CRYSTAL AND LAMINATE

TECHNICAL FIELD

The present invention relates to crystals and laminates, and more particularly, to a crystal that is MgMO when M is a 3d transition metal element, for example, and a laminate including the crystal as a film.

BACKGROUND ART

In recent years, technological development has been actively promoted for processing information with the use of spin having a charge, and controlling the spin and the charge independently of each other. For example, there are suggested devices that use spin-polarized conduction electrons, such as a MRAM (Magnetic Random Access Memory) and a spin transistor.

Non-Patent Document 1 predicts that a crystal structure of MgO (magnesium oxide) may be h-MgO (hereinafter also referred to as a hexagonal structure), other than a wurtzite structure or a rock-salt structure. Non-Patent Documents 2 and 3 disclose anomalous Hall effects in ferromagnetic materials.

PRIOR ART DOCUMENTS

Non-Patent Documents

Non-Patent Document 1: Physical Review B Vol. 63, 104103 (2001)
Non-Patent Document 2: Physical Review Letters Vol. 97, 126602 (2006)
Non-Patent Document 3: JJAP Express Letter Vol. 46, L642-L644 (2007)

SUMMARY OF THE INVENTION

Problem to be Solved by the Invention

In a device using spin-polarized conduction electrons, high-efficiency generation of spin-polarized conduction electrons is required. A sample with high Hall mobility normally has high conductance. The high conductance is derived from high electron density in this case, and mobility is low in most cases. Examples of samples with high electron density include ferromagnetic metals such as Fe and Co. In a ferromagnetic metal, the spin polarizability of conduction electrons is 60% or lower. The spin polarizability of conduction electrons varies depending on interactions with localized spin. For example, if conduction electrons can have high electron mobility at low electron density, spin polarizability will be determined by skew scattering. Accordingly, there is a possibility that high spin polarizability can be realized.

The present invention has been made in view of the above problem, and aims to provide a laminate that generates spin-polarized conduction electrons with high efficiency, and a crystal that can form the laminate.

Means for Solving the Problem

The present invention is a laminate that includes: a foundation layer that is a crystal having a wurtzite structure; and a $Mg_XM_{1-X}O$ film having a hexagonal film formed on the foundation layer, where M is a 3d transition metal element, and $0<X<1$. The hexagonal structure is the crystal structure shown in FIG. 8, where Mg or M is denoted by 20, and O is denoted by 22. According to the present invention, spin-polarized conduction electrons can be generated with high efficiency.

In the above structure, the lattice constants a and b of the foundation layer may be greater than the lattice constants a and b of a case where the $Mg_XM_{1-X}O$ film has a wurtzite structure.

In the above structure, the foundation layer may be zinc oxide having a wurtzite structure. With this structure, a $Mg_XM_{1-X}O$ film having a hexagonal structure can be formed.

In the above structure, the M may be Co, and the thickness of the $Mg_XM_{1-X}O$ film may be 60 nm or smaller.

In the above structure, the M may be Co, and X in the $Mg_XM_{1-X}O$ film may be not smaller than 0.1 and not greater than 0.5.

In the above structure, the $Mg_XM_{1-X}O$ film may have a cap layer formed thereon, and the lattice constants a and b of the crystal forming the cap layer may be greater than the lattice constants a and b of a case where the $Mg_XM_{1-X}O$ film has a wurtzite structure.

In the above structure, the $Mg_XM_{1-X}O$ film may be a $Mg_XCo_{1-X}O$ film. Also, in the above structure, the $Mg_XM_{1-X}O$ film may be a $Mg_XCo_YZn_{1-X-Y}O$ film, where M is Co and Zn, and $0<Y<1$.

The present invention is a crystal that is $Mg_XM_{1-X}O$ having a hexagonal structure, where M is a 3d transition metal element, and $0<X<1$. The hexagonal structure is the crystal structure shown in FIG. 8, where Mg or M is denoted by 20, and O is denoted by 22. According to the present invention, it is possible to provide a crystal for realizing a laminate that can generate spin-polarized conduction electrons with high efficiency.

In the above structure, the $Mg_XM_{1-X}O$ may be $Mg_XCo_{1-X}O$. Also, in the above structure, the $Mg_XM_{1-X}O$ may be $Mg_XCo_YZn_{1-X-Y}O$, where M is Co and Zn, and $0<Y<1$.

Effects of the Invention

According to the present invention, it is possible to provide a laminate that generates spin-polarized conduction electrons with high efficiency, and a crystal that can form the laminate. In view of the progress of spin electronics, these products are useful as electronic devices, transistors, and the like.

MODES FOR CARRYING OUT THE EMBODIMENTS

Figure 1A:
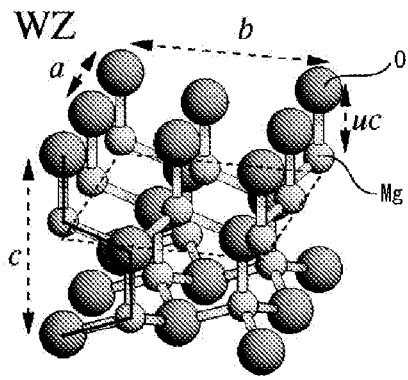
FIGS. 1A through 1C are diagrams showing the MgO crystal structures shown in FIG. 1 of Non-Patent Document 1.
Figure 1B:
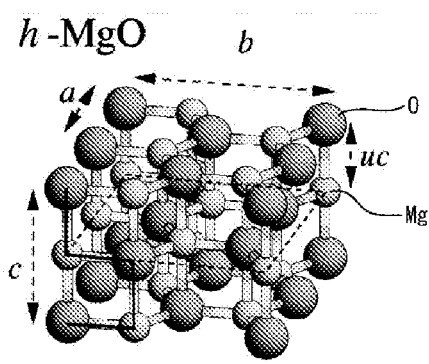
Figure 1C:
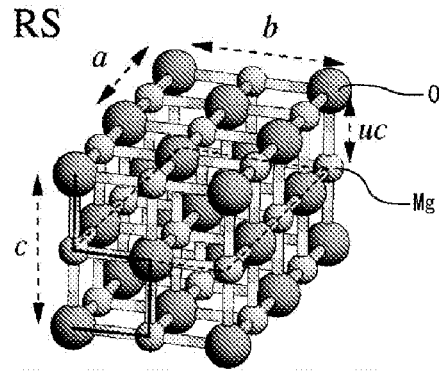

FIGS. 1A through 1C are diagrams showing the crystal structures of MgO shown in FIG. 1 of Non-Patent Document 1. It is theoretically predicted that, other than a wurtzite structure (WZ) and a rock-salt structure (RS), a h-MgO structure is stable as a crystal structure of MgO. As shown in FIG. 1A, in a wurtzite structure, four O (oxygen) atoms are linked to a Mg (magnesium) atom. As shown in FIG. 1C, in a rock-salt structure, six O atoms are linked to a Mg atom. As shown in FIG. 1B, in a hexagonal structure, each Mg of a wurtzite structure is also linked to the O atoms thereabove and therebelow. Accordingly, each Mg is linked to five O atoms. The lattice constant c in the Z-direction of the hexagonal structure is substantially the same as that of the rock-salt structure. Meanwhile, the lattice constants a and b of the hexagonal structure are substantially the same as those of the wurtzite structure.

The inventor has confirmed that spin-polarized electrons can be generated with high efficiency in a laminate formed with a $Mg_XCo_{1-X}O$ (hereinafter also written as MgCoO) crystal that is a mixed crystal of MgO and CoO (cobalt oxide). A $Mg_XCo_{1-X}O$ crystal has the most stabilized phase in a rock-salt structure at room temperature and atmospheric pressure. When a $Mg_XCo_{1-X}O$ (0<X<1) crystal is formed on a crystal having a wurtzite structure, an unstable phase can be formed before the thickness increases to such a thickness that the $Mg_XCo_{1-X}O$ crystal is lattice-relaxed. It was confirmed that this unstable phase was a hexagonal structure.

First Embodiment

Figure 2:
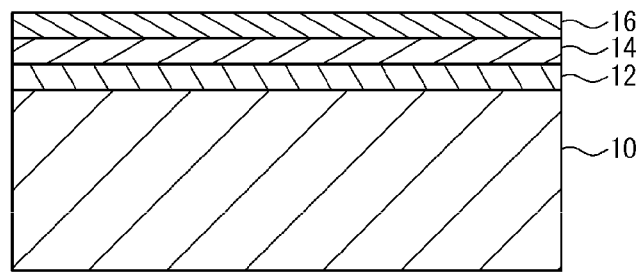
FIG. 2 is a cross-sectional view of a crystal according to a first embodiment.
Figure 3A:
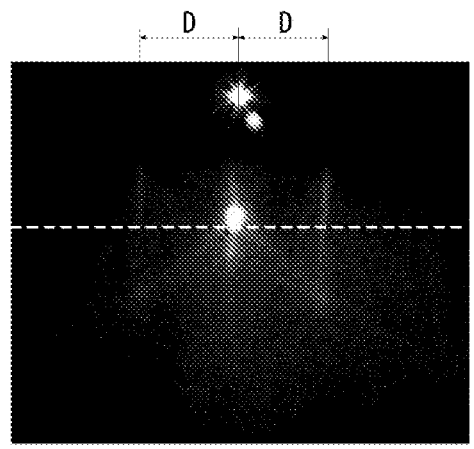
FIGS. 3A through 3C show RHEED images captured when a MgCoO film having a thickness of 60 nm or smaller was deposited.
Figure 3B:
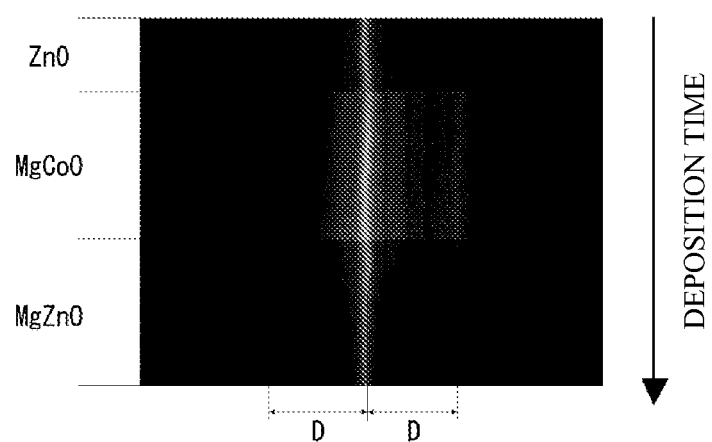
Figure 3C:

FIG. 2 is a cross-sectional view of a laminate according to a first embodiment. By MBE (Molecular Beam Epitaxy), a ZnO (zinc oxide) film 12 as a foundation layer was deposited on a ZnO substrate 10, a $Mg_XCo_{1-X}O$ film 14 was deposited on the ZnO film 12, and a $Mg_YZn_{1-Y}O$ (hereinafter also written as MgZnO) film 16 (0<Y<1) having Y=0.05 was deposited as a cap layer on the $Mg_XCo_{1-X}O$ film 14. The respective films were stacked as single crystals. The conditions for the deposition are as follows.
Elements supplied for MBE: Mg (magnesium), Co (cobalt), Zn (zinc), $O_2$ (oxygen) radical
Deposition temperature: 750° C. (measured with a thermoviewer)
Zn material: Zn metal, supplied by a Knudsen cell
Zn supply vapor pressure: $4 \times 10^{-4}$ Pa
Mg material: Mg metal, supplied by a Knudsen cell
Mg supply vapor pressure: $1 \times 10^{-5}$ Pa
Co material: Co metal, supplied by a Knudsen cell
Co supply vapor pressure: $1 \times 10^{-5}$ Pa
$O_2$ radical generation method: 200 W plasma source
$O_2$ radical flow rate: 2 sccm When a $Mg_XCo_{1-X}O$ film 14 in which X is 0.5 was formed, RHEED (Reflection High Energy Electron Diffraction) observation was conducted. FIGS. 3A through 3C show RHEED images captured when a MgCoO film 14 having a thickness of 60 nm or smaller was deposited. FIG. 3A shows a RHEED image captured when the ZnO film 12 was being deposited. FIG. 3B shows a RHEED image captured when the ZnO film 12, the MgCoO film 14, and the MgZnO film 16 were being deposited. FIG. 3C shows a RHEED image captured after the deposition of the MgZnO film. The thickness of the ZnO film 12 is 100 nm, the thickness of the MgCoO film 14 is 30 nm, and the thickness of the MgZnO film 16 is 100 nm.

Figure 4A:
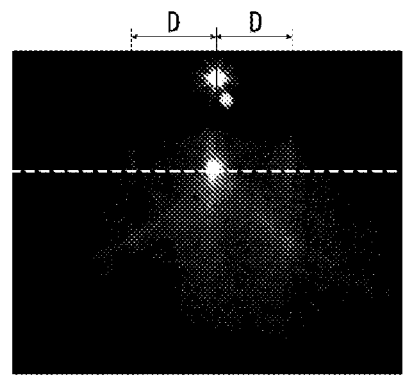
FIGS. 4A through 4C show RHEED images captured when a MgCoO film having a greater thickness than 60 nm was deposited.
Figure 4B:
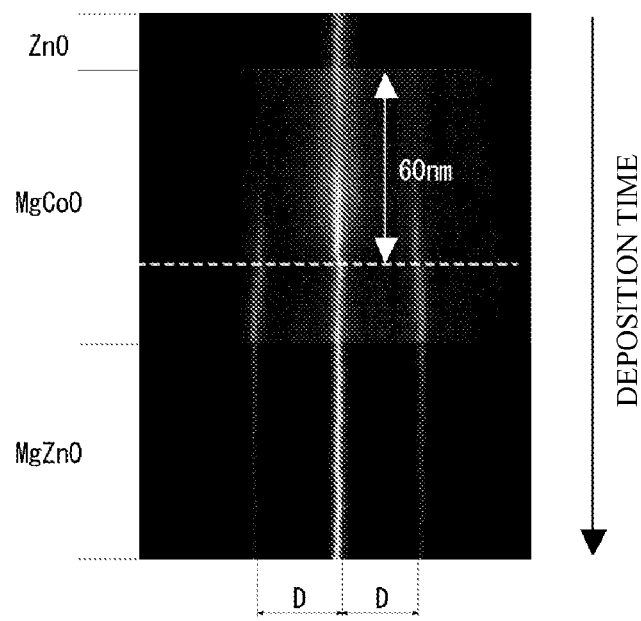
Figure 4C:
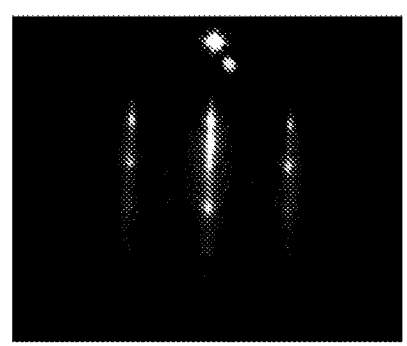

FIGS. 4A through 4C show RHEED images captured when a MgCoO film having a greater thickness than 60 nm was deposited. The thickness of the ZnO film 12 is 100 nm, the thickness of the MgCoO film 14 is greater than 60 nm, and the thickness of the MgZnO film 16 is 100 nm. FIGS. 4A through 4C are equivalent to FIGS. 3A through 3C. As can be seen from FIG. 3A and FIG. 4A, the RHEED pattern is stable while the ZnO film 12 is being deposited. The distance D between the center spot and either side spot corresponds to the lattice constant a. A shorter distance D corresponds to a larger lattice constant a. In a hexagonal crystal structure such as a wurtzite structure or a hexagonal structure, the lattice constant a and the lattice constant b are proportional to each other, and it is considered that the lattice constant b varies with changes in the lattice constant a.

In FIG. 3B and FIG. 4B, the vertical direction indicates deposition time. Signals indicated by the white dashed lines in FIG. 3A and FIG. 4A are shown with respect to deposition time. The distance D between the center spot and either side spot corresponds to the lattice constant a. In FIG. 3B, the distance D hardly varies during the deposition of the ZnO film 12, the deposition of the MgCoO film 14, and the deposition of the MgZnO film 16. This implies that the lattice constant a hardly varies between the ZnO film 12 and the MgZnO film 16.

In FIG. 4B, on the other hand, the distance D becomes longer in the middle of the deposition of the MgCoO film 14 (at the time when the thickness of the MgCoO film 14 reaches 60 nm after the start of the growth thereof). This implies that lattice relaxation occurred and the lattice constant a became smaller. That is, a rock-salt structure is formed in the MgCoO film 14 having a greater thickness than 60 nm.

As can be seen from the RHEED image after the deposition of the MgZnO film 16, the surface is quite smooth as shown in FIG. 3C. As shown in FIG. 4C, on the other hand, when the thickness of the MgCoO film 14 exceeds 60 nm, spot diffraction points are observed, and the surface is roughened. This is supposedly because the depositional surface was roughened by lattice relaxation of the MgCoO film 14.

As described above, the results of the RHEED in FIGS. 3A through 4C show that the lattice constant a is substantially the same as that of a wurtzite structure when the thickness of the MgCoO film 14 is 60 nm or smaller. When the thickness of the MgCoO film 14 exceeds 60 nm, the lattice constant a becomes the same as that of a rock-salt structure.

Figure 5A:
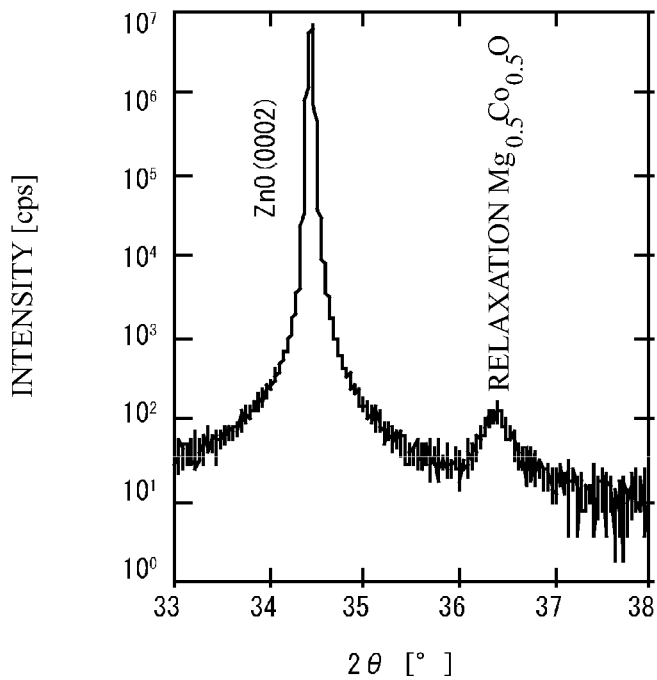
FIGS. 5A and 5B show results of XRD measurement.
Figure 5B:
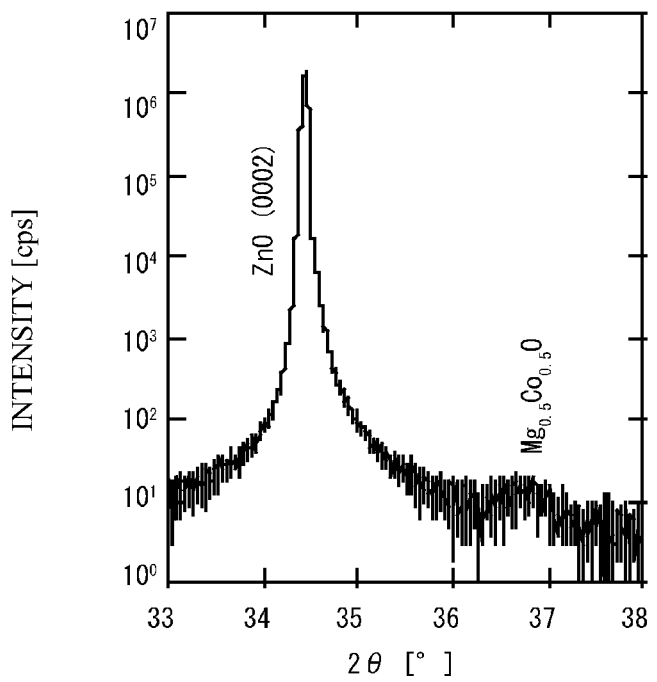

Next, XRD (X-ray diffraction) measurement of the $Mg_XCo_{1-X}O$ film 14 in which X is 0.5 was carried out. FIGS. 5A and 5B show the results of the XRD measurement. FIG. 5A shows the result of the XRD measurement of a lattice-relaxed MgCoO film 14 (or a MgCoO film 14 deposited until the thickness thereof becomes greater than 60 nm). FIG. 5B shows the result of the XRD measurement of a MgCoO film that is not lattice-relaxed (or a MgCoO film 14 of 60 nm or smaller in thickness). As can be seen from FIGS. 5A and 5B, the lattice constant c of ZnO having a wurtzite structure is 0.2603 nm. The lattice constant c of the MgCoO film 14 in FIG. 5A was 0.244 nm, and the lattice constant c of the MgCoO film 14 was 0.247 nm.

As described above, the lattice constant c of a rock-salt structure formed after lattice relaxation was substantially the same as the lattice constant c of a structure in which the thickness was 60 nm or smaller and lattice relaxation had not occurred.

As can be seen from those results, the MgCoO film 14 having a thickness of 60 nm or smaller has the same lattice constant a as that of a wurtzite structure, and has the same lattice constant c as that of a rock-salt structure. In view of the above, the MgCoO film 14 having a thickness of 60 nm or smaller is considered to have a hexagonal structure. That is, the MgCoO film 14 is considered to be a structure in which Mg or Co atoms have entered the Mg sites in FIG. 1B, and O atoms have entered the O sites in FIG. 1B. On the other hand, the MgCoO film 14 having a greater thickness than 60 nm is lattice-relaxed, and is turned into a rock-salt structure of a stabilized phase.

In a case where the $Mg_XCo_{1-X}O$ film 14 in which X is 0.5 has a rock-salt structure of the most stabilized phase, there is approximately 7% lattice mismatching with respect to the ZnO film 12. As a result, a great surface energy is generated in the surface of the $Mg_XCo_{1-X}O$ film 14. Accordingly, when the thickness of the $Mg_XCo_{1-X}O$ film 14 exceeds the critical thickness (60 nm in the first embodiment), the $Mg_XCo_{1-X}O$ film 14 has its lattice strain relaxed, and is turned into a rock-salt structure. When the thickness is equal to or smaller than the critical thickness, on the other hand, the $Mg_XCo_{1-X}O$ film 14 is turned into a hexagonal structure.

Second Embodiment

In a second embodiment, a 30-nm thick $Mg_XCo_{1-X}O$ film 14 in which X was 0.5 was manufactured as a sample 1 of a laminate, and a 10-nm thick $Mg_XCo_{1-X}O$ film 14 in which X was 0.1 was manufactured as a sample 2 of a laminate. ZnO films 12 and MgZnO films 16 are the same as those of the first embodiment. The samples 1 and 2 were processed into Hall bars.

With the use of the samples in the form of Hall bars, temperature dependence of electric resistance, magnetoresistance in magnetic fields, and Hall effects were measured. The temperature dependence of electric resistance was similar to that of a metal. A large positive magnetoresistive effect of approximately 60% was achieved. As for the magnetic field dependence of the Hall resistance at a temperature of 4 K, a normal Hall effect and an anomalous Hall effect were observed. It is known that an anomalous Hall effect is related to spin polarization. Where the ratio between the vertical magnetic conductance $\sigma_{XX}$ and the Hall conductance $\sigma_{XY}$ of an anomalous Hall effect is high, spin-polarized current can be generated with high efficiency.

Figure 6:
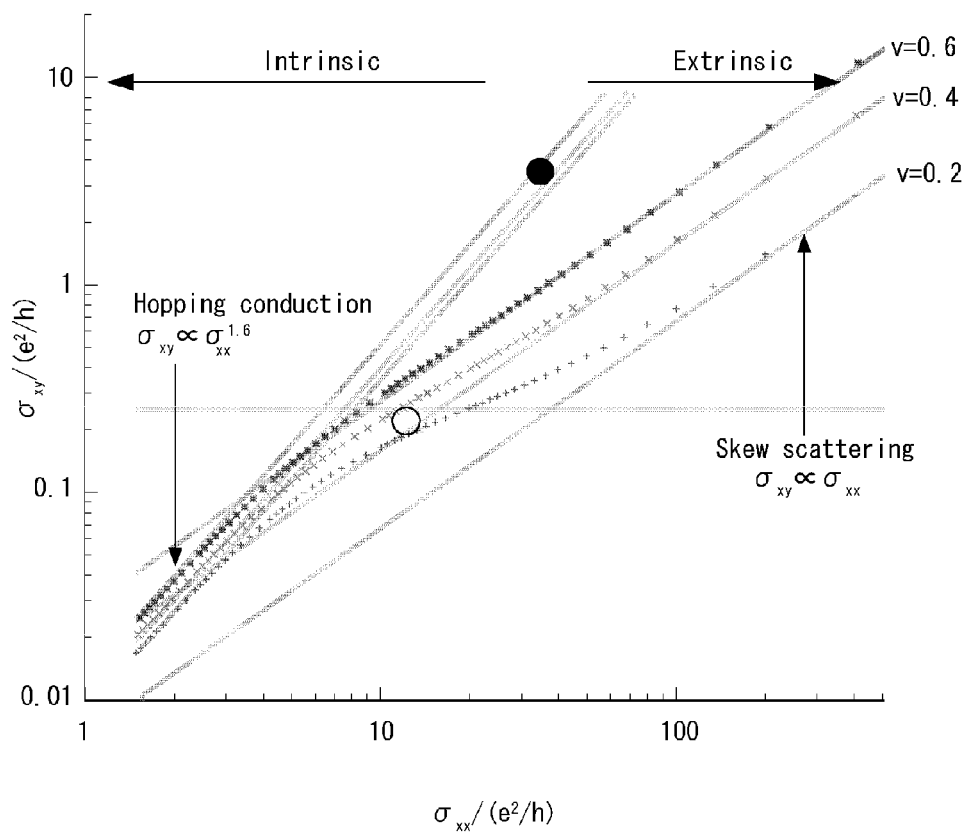
FIG. 6 is a diagram showing the results of a second embodiment superimposed on FIG. 4 of Non-Patent Document 2.

FIG. 6 is a diagram showing the results of the second embodiment superimposed on FIG. 4 of Non-Patent Document 2. Based on the result of measurement of the anomalous Hall effect, $\sigma_{XY}$ was calculated on the assumption that the structures according to the second embodiment were two-dimensionally conducted. In FIG. 6, the white circle represents the sample 1, and the black circle represents the sample 2. In both of the samples 1 and 2, $\sigma_{XY}/\sigma_{XX}$ is a great value. This indicates that MgCoO shows high efficiency in generating spin-polarized conduction electrons in the second embodiment.

Figure 7:
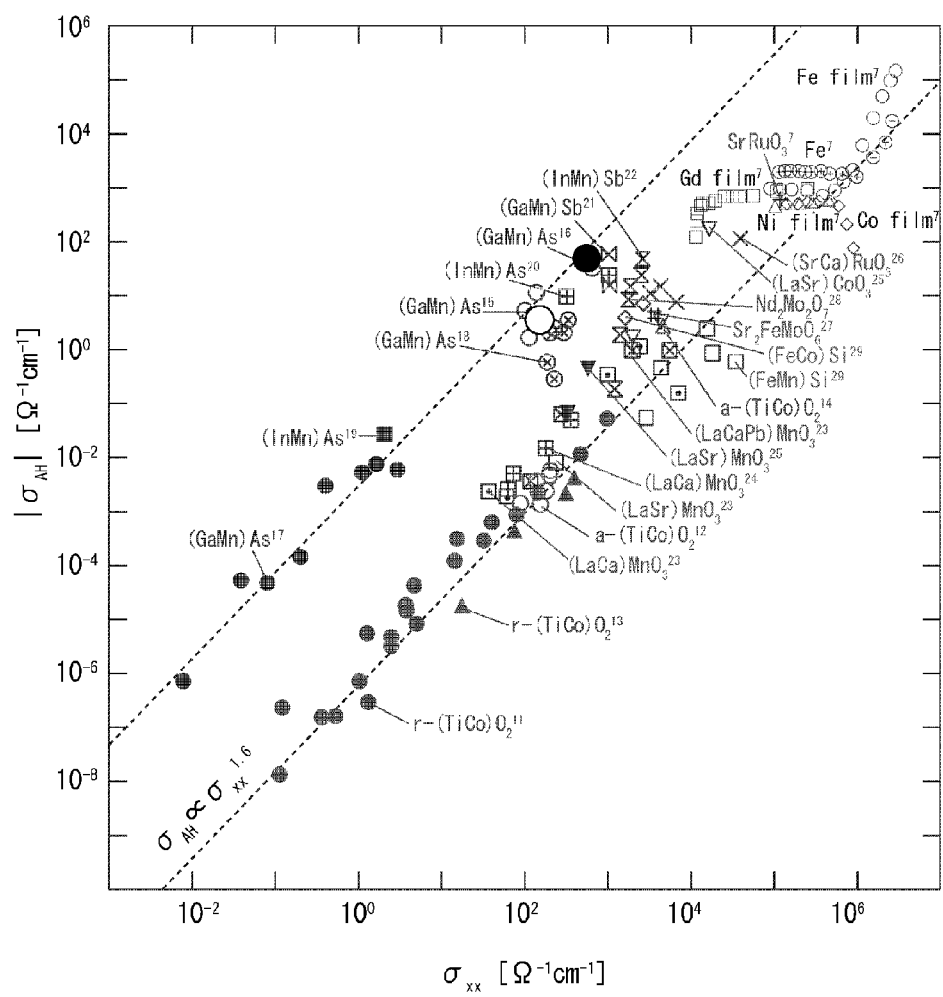
FIG. 7 is a diagram showing the results of the second embodiment superimposed on FIG. 1 of Non-Patent Document 3.

FIG. 7 is a diagram showing the results of the second embodiment superimposed on FIG. 1 of Non-Patent Document 3. $\sigma_{AH}$ was calculated on the assumption that the structures according to the second embodiment were three-dimensionally conducted over a width of approximately 30 nm. Although the MgCoO film 14 is an insulator, two-dimensional electrons are generated in the interface of the ZnO film 12 on the side of the MgCoO film 14 and the interface of the MgZnO film 16 on the side of the MgCoO film 14, due to the differences in intrinsic polarization among the ZnO film 12, the MgCoO film 14, and the MgZnO film 16. In view of this, it was assumed that a conductive layer having a width of approximately 30 nm, including the interface between the ZnO film 12 and the MgCoO film 14 and the interface between the MgZnO film 16 and the MgCoO film 14, was formed. As shown in FIG. 7, $\sigma_{AH}/\sigma_{XX}$ is a great value in both of the samples 1 and 2.

As described above, regardless of whether the conduction in the second embodiment is assumed to be two-dimensional conduction or three-dimensional conduction, $\sigma_{XY}/\sigma_{XX}$ and $\sigma_{AH}/\sigma_{XX}$ of anomalous Hall effects exhibit great values. In view of this, the crystal structures according to the second embodiment are considered to have high efficiency in generating spin-polarized conduction electrons. Even if part of the MgCoO film 14 is lattice-relaxed, highly spin-polarized conduction electrons are obtained. Such an effect is observed at temperatures of 20 K and lower. This is supposedly because such an effect depends on magnetic transition temperature.

As in the second embodiment, it is considered that an electron system having high mobility and high spin polarizability is generated in the interface between the $Mg_XCo_{1-X}O$ film 14 having a hexagonal structure and the ZnO film 12 having a wurtzite structure.

The $Mg_XCo_{1-X}O$ film 14 is formed on a foundation layer (the ZnO film 12, for example) having lattice constants a and b that are greater than the lattice constants a and b of a MgCoO film 14 having a wurtzite structure. Since the foundation layer has greater lattice constants than those of the MgCoO film 14, the MgCoO film 14 expands in the a- and b-directions in the wurtzite structure shown in FIG. 1A. As a result, each Mg or Co atom is linked to the O atom thereabove or therebelow to which Mg or Co has not been linked, and the hexagonal structure shown in FIG. 1B is readily formed.

As the foundation layer, zinc oxide (ZnO) having a wurtzite structure can be used as in the first and second embodiments. The lattice constants a and b of zinc oxide are approximately 7% greater than the lattice constants a and b of the MgCoO film 14 having a wurtzite structure. Therefore, the MgCoO film 14 on the ZnO film 12 is readily turned into a hexagonal structure. $ScAlMgO_4$ or the like can also be used as the foundation layer having a wurtzite structure with greater lattice constants a and b than those of the MgCoO film 14.

To turn the MgCoO film 14 into a hexagonal structure as shown in FIG. 4B, the thickness of the MgCoO film 14 is preferably 60 nm or smaller, or more preferably, 30 nm or smaller, or even more preferably, 20 nm or smaller. For the MgCoO film 14 to function properly, the thickness of the MgCoO film 14 is preferably 1 nm or greater, or more preferably, 5 nm or greater.

Further, the MgZnO film 16 having lattice constants a and b that are greater than the lattice constants a and b of the MgCoO film 14 having a wurtzite structure is formed as a cap layer on the MgCoO film 14. The cap layer has the function to stabilize the MgCoO film 14. The thickness and the Mg density of the MgZnO film 16 do not greatly affect generation of spin-polarized conduction electrons. Accordingly, a ZnO film may be used as the cap layer.

As can be seen from FIGS. 6 and 7, while the value of X in the $Mg_XCo_{1-X}O$ film 14 is in the range of 0.1 to 0.5, $\sigma_{XY}/\sigma_{XX}$ and $\sigma_{AH}/\sigma_{XX}$ of anomalous Hall effects are high. Accordingly, as long as the value of X is not smaller than 0.1 and not greater than 0.5, the efficiency of generation of spin-polarized conduction electrons is high. The value of X is preferably not smaller than 0.2 and not greater than 0.4. In a $Mg_XM_{1-X}O$ film having a hexagonal structure in which M is a 3d transition metal element, the value of X is also preferably not smaller than 0.1 and not greater than 0.5, or more preferably, not smaller than 0.2 and not greater than 0.4.

Although the MgCoO film 14 has been described as a film having a hexagonal structure in the first and second embodiments, a $Mg_XM_{1-X}O$ film having a hexagonal film may be used when M is a 3d transition metal element. Here, the 3d transition metal element M may be a first transition element such as Zn (zinc), Mn (manganese), Ni (nickel), Co (cobalt), Sc (scandium), Ti (titanium), V (vanadium), Cr (chromium), Fe (iron), or Cu (copper), or may be a mixture of some of those elements. As a hexagonal structure is obtained by forming an interface with a rock-salt structure substance group as a wurtzite structure according to the concept of the first and second embodiments, any of the above 3d transition metal elements other than Co can be used as M. As a transition metal element that can have a divalent electron configuration and become a source of magnetism, M is preferably Co, Fe, Mn, or Ni in the rock-salt structure substance group, or a mixture of those elements. Further, Zn (zinc) may be mixed therewith. Since zinc oxide has a stabilized structure as a hexagonal system, the addition of Zn is effective in stabilizing the hexagonal structure. Particularly, when zinc oxide is used as the foundation layer, Zn diffuses into the MgCoO film 14, which is then turned into a $Mg_XCo_YZn_{1-X-Y}O$ film ($0<X<1$, $0<Y<1$) that has a hexagonal structure and can achieve the same characteristics as those of a MgCoO film.

Furthermore, in a substance group having intrinsic polarization such as a wurtzite structure, a conduction electron system is generated so as to eliminate electrostatic instability due to a polarization difference in the interface between different materials. In the interface between a wurtzite structure and a hexagonal structure, conduction electrons having high electron mobility at low electron density are generated. As a result, spin polarizability is determined by skew scattering. That is, by causing an interaction between the conduction electrons and the localized spin of a 3d transition metal, conduction electrons having high spin polarizability can be generated as in the second embodiment. According to this concept, the foundation layer 12 should have a wurtzite structure, and the layer on the foundation layer 12 should be a $Mg_XM_{1-X}O$ film that has a hexagonal structure when M is a 3d transition metal element. The temperature at which spin polarization is caused can be changed by selecting a 3d transition metal as appropriate. For example, when a material having a higher magnetic transition temperature is selected, spin polarization can be realized at a higher temperature. In the above described manner, the inventor found a crystal that was $Mg_XM_{1-X}O$ having a hexagonal structure. With this $Mg_XM_{1-X}O$ crystal having a hexagonal structure, a $Mg_XM_{1-X}O$ film for realizing a laminate that can generate spin-polarized conduction electrons with high efficiency can be provided.

It should be noted that some other element may be included in the $Mg_XM_{1-X}O$ film as long as a hexagonal structure can be formed.

Figure 8:
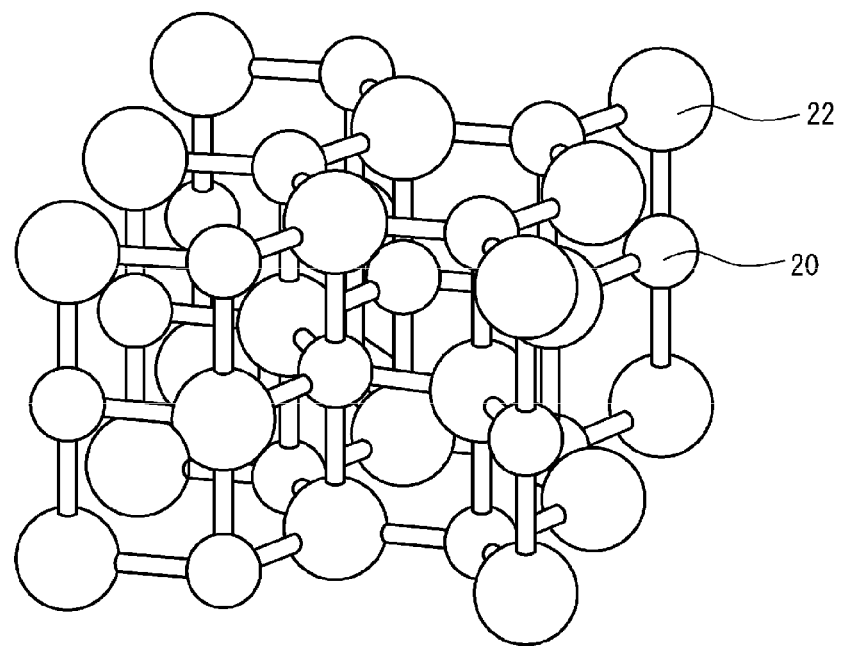
FIG. 8 is a diagram showing a crystal structure having a hexagonal structure.

FIG. 8 is a diagram showing a crystal structure that has a hexagonal structure. Where Mg or M is denoted by 20, O is denoted by 22, and linkage between 20 and 22 is indicated by a bar, the hexagonal structure has the crystal structure shown in FIG. 8. In the hexagonal structure, an atom 20 of a wurtzite structure is linked to the atoms 22 thereabove and therebelow, and is linked to five atoms 22.

In a case where spins are injected from a ferromagnetic metal into a high-mobility two-dimensional electron gas or a low-carrier-density semiconductor material, high-efficiency spin injection can be performed by injecting spins via a Schottky junction or a tunneling insulator film. However, when spins are injected via a Schottky junction or a tunneling insulator film, conductance becomes lower. According to the present invention, high-efficiency spin injection can be performed on a two-dimensional electron gas or a low-carrier-density semiconductor material without the use of a Schottky junction or a tunneling insulator film. This is because mismatch in low electron density is small. In this manner, spin-polarized conduction electrons can be generated with high efficiency. Accordingly, the present invention can be applied to spin transistors using spin-polarized conduction electrons, for example.

Although preferred embodiments of the present invention have been described in detail, the present invention is not limited to those specific examples, and various changes and modifications may be made to them within the scope of the invention claimed herein.

DESCRIPTION OF REFERENCE NUMERALS

10 ZnO substrate
12 ZnO film
14 MgCoO film
16 MgZnO film
20 Mg or M
22 O

The invention claimed is:

1. A laminate comprising:
a foundation layer that is a crystal having a wurtzite structure; and
a $Mg_XM_{1-X}O$ film having a hexagonal structure formed on the foundation layer, where M is Mn, Ni, Co, Sc, Ti, V, Cr, Fe, or Cu, or a mixture thereof, or a mixture of Mn, Ni, Co, Sc, Ti, V, Cr, Fe, or Cu, or the mixture thereof and Zn, and $0<X<1$,
the hexagonal structure being the crystal structure shown below, where Mg or M is denoted by 20, and O is denoted by 22

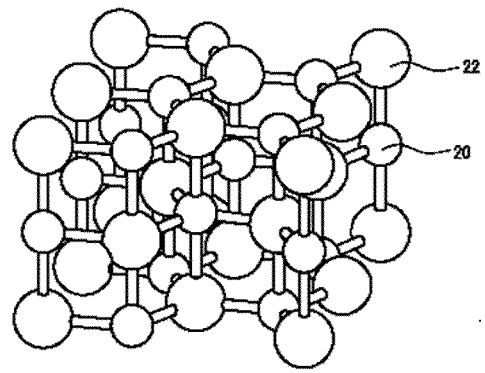

2. The laminate according to claim 1, wherein lattice constants a and b of the foundation layer are greater than lattice constants a and b of a case where the $Mg_XM_{1-X}O$ film has a wurtzite structure.

3. The laminate according to claim 1, wherein the foundation layer is zinc oxide having a wurtzite structure.

4. The laminate according to claim 1, wherein the M is Co, and a thickness of the $Mg_XM_{1-X}O$ film is 60 nm or smaller.

5. The laminate according to claim 1, wherein the M is Co, and X in the $Mg_XM_{1-X}O$ film is not smaller than 0.1 and not greater than 0.5.

6. The laminate according to claim 1, wherein the $Mg_XM_{1-X}O$ film is a $Mg_XCo_YZn_{1-X-Y}O$ film, where M is Co and Zn, and $0<y<1$.

7. A laminate comprising:
a foundation layer that is a crystal having a wurtzite structure; and
a $Mg_xM_{1-x}O$ film having a hexagonal structure formed on the foundation layer, where M is a 3d transition metal element, and $0<x<1$,
the hexagonal structure being the crystal structure shown below, where Mg or M is denoted by 20, and O is denoted by 22:

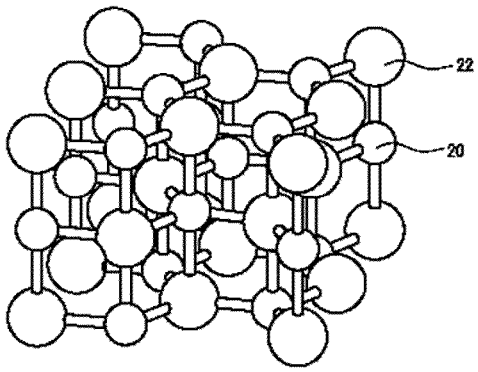

wherein
the $Mg_xM_{1-x}O$ film has a cap layer formed thereon, and
lattice constants a and b of a crystal forming the cap layer are greater than lattice constants a and b of a case where the $Mg_xM_{1-x}O$ film has a wurtzite structure.

8. A laminate comprising:
a foundation layer that is a crystal having a wurtzite structure; and
a $Mg_xM_{1-x}O$ film having a hexagonal structure formed on the foundation layer, where $0<X<1$,
the hexagonal structure being the crystal structure shown below, where Mg or Co is denoted by 20, and O is denoted by 22

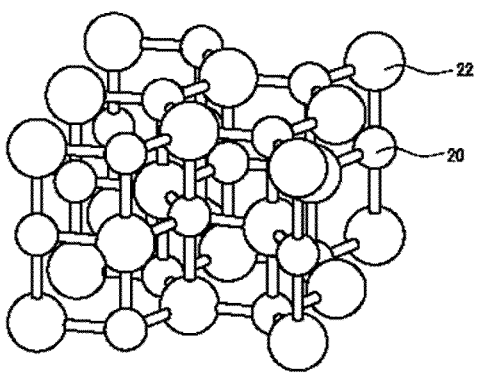

9. A crystal that is $Mg_xM_{1-x}O$ having a hexagonal structure, where M is Mn, Ni, Co, Sc, Ti, V, Cr, Fe, or Cu, or a mixture thereof, or a mixture of Mn, Ni, Co, Sc, Ti, V, Cr, Fe, or Cu, or the mixture thereof and Zn, and $0<X<1$,
the hexagonal structure being the crystal structure shown below, where Mg or M is denoted by 20, and O is denoted by 22

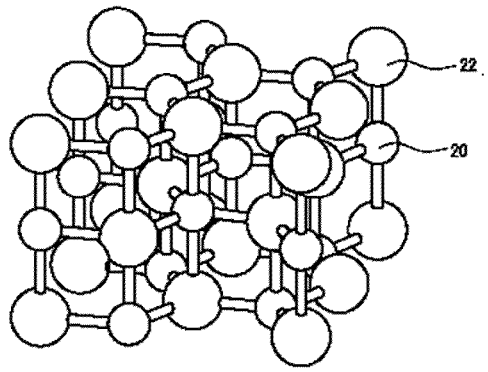

10. The crystal according to claim 9, wherein the $Mg_xM_{1-x}O$ is $Mg_xCo_yZn_{1-X-Y}O$, where M is Co and Zn, and $0<Y<1$.

11. A crystal that is $Mg_xCo_{1-x}O$ having a hexagonal structure, where $0<X<1$,
the hexagonal structure being the crystal structure shown below, where Mg or Co is denoted by 20, and O is denoted by 22

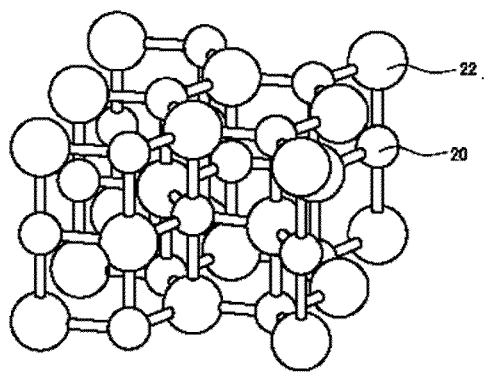

* * * * *